(12) United States Patent
Fukunaga et al.

(10) Patent No.: US 11,164,828 B2
(45) Date of Patent: Nov. 2, 2021

(54) AMPLIFIER

(71) Applicant: Mitsubishi Electric Corporation, Tokyo (JP)

(72) Inventors: Kei Fukunaga, Tokyo (JP); Shinichi Miwa, Tokyo (JP); Yoshinobu Sasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 24 days.

(21) Appl. No.: 16/603,839

(22) PCT Filed: May 17, 2017

(86) PCT No.: PCT/JP2017/018581
§ 371 (c)(1),
(2) Date: Oct. 9, 2019

(87) PCT Pub. No.: WO2018/211643
PCT Pub. Date: Nov. 22, 2018

(65) Prior Publication Data
US 2020/0118950 A1    Apr. 16, 2020

(51) Int. Cl.
*H03F 3/16* (2006.01)
*H01L 23/66* (2006.01)
(Continued)

(52) U.S. Cl.
CPC .............. *H01L 23/66* (2013.01); *H01L 24/06* (2013.01); *H01L 24/48* (2013.01); *H01L 24/49* (2013.01);
(Continued)

(58) Field of Classification Search
CPC ......... H01L 23/66; H01L 24/06; H01L 24/48; H01L 24/49; H01L 29/0696;
(Continued)

(56) References Cited

U.S. PATENT DOCUMENTS 5,371,405 A * 12/1994 Kagawa .................. H01L 23/66
257/664
5,576,661 A * 11/1996 Kumagai ................ H01P 5/028
330/277
(Continued)

FOREIGN PATENT DOCUMENTS

JP   S63-141328 A   6/1988
JP   H06-310955 A   11/1994
(Continued)

OTHER PUBLICATIONS

International Search Report; Written Opinion; and Notification of Transmittal of the International Search Report and the Written Opinion of the International Searching Authority, or the Declaration issued in PCT/JP2017/018581; dated Jul. 18, 2017.
(Continued)

*Primary Examiner* — Khanh V Nguyen
(74) *Attorney, Agent, or Firm* — Studebaker & Brackett PC

(57) ABSTRACT

An amplifier includes a transistor chip including a plurality of transistor cells, a gate pad, and a drain pad, a matching substrate having a surface on which a metal pattern is formed, a terminal with a width larger than a width of the transistor chip and than a width of the matching substrate, a plurality of terminal wires connecting the terminal to the metal pattern, and a plurality of chip wires connecting the metal pattern to the transistor chip. Inter-wire distances of portions of the plurality of terminal wires connected to the metal pattern are larger than inter-wire distances between portions of the plurality of terminal wires connected to the terminal.

12 Claims, 3 Drawing Sheets

(51) Int. Cl.
*H01L 23/00* (2006.01)
*H01L 29/06* (2006.01)
*H03F 1/56* (2006.01)
*H03F 3/193* (2006.01)

(52) U.S. Cl.
CPC ........... *H01L 29/0696* (2013.01); *H03F 1/56* (2013.01); *H03F 3/193* (2013.01); *H01L 2223/6611* (2013.01); *H01L 2223/6655* (2013.01); *H01L 2224/04042* (2013.01); *H01L 2224/48091* (2013.01); *H01L 2224/48153* (2013.01); *H01L 2224/49176* (2013.01); *H01L 2924/1033* (2013.01); *H01L 2924/30111* (2013.01); *H03F 2200/222* (2013.01); *H03F 2200/387* (2013.01)

(58) Field of Classification Search
CPC ..... H01L 2223/6611; H01L 2223/6655; H01L 2224/04042; H01L 2224/48091; H01L 2224/48153; H01L 2224/49176; H01L 2924/1033; H01L 2924/30111; H01L 2224/49175; H01L 2224/49111; H01L 2224/49113; H01L 23/047; H01L 2224/48137; H01L 2924/00014; H03F 1/56; H03F 3/193; H03F 2200/222; H03F 2200/387; H03F 3/195; H03F 3/191; H03F 1/565
USPC .......................................... 330/277, 295, 302
See application file for complete search history.

(56) References Cited

U.S. PATENT DOCUMENTS

| | | | | |
|---|---|---|---|---|
| 5,973,567 | A * | 10/1999 | Heal | ............. H01L 23/66 330/277 |
| 6,023,080 | A | 2/2000 | Kojima | |
| 7,786,603 | B2 * | 8/2010 | Piel | ............. H01L 25/16 257/784 |
| 8,912,647 | B2 * | 12/2014 | Takagi | ............. H01L 23/642 257/728 |
| 9,627,300 | B2 * | 4/2017 | Kosaka | ............. H01L 24/49 |
| 2013/0169366 | A1 | 7/2013 | Deguchi et al. | |
| 2015/0214905 | A1 | 7/2015 | Miyazawa | |
| 2017/0077012 | A1 | 3/2017 | Kosaka et al. | |

FOREIGN PATENT DOCUMENTS

| | | |
|---|---|---|
| JP | H08-17999 A | 1/1996 |
| JP | H10-223674 A | 8/1998 |
| JP | H11-238851 A | 8/1999 |
| JP | 2012-28880 A | 2/2012 |
| JP | 2017-059650 A | 3/2017 |
| KR | 10-2017-0033239 A | 3/2017 |

OTHER PUBLICATIONS

An Office Action; "Notification of Reasons for Refusal," mailed by the Japanese Patent Office dated Jun. 23, 2020, which corresponds to Japanese Patent Application No. 2019-518682 and is related to U.S. Appl. No. 16/603,839 with English language translation.

An Office Action; "Notice of Reasons for Refusal," mailed by the Japanese Patent Office dated Sep. 1, 2020, which corresponds to Japanese Patent Application No. 2019-518682 and is related to U.S. Appl. No. 16/603,839; with English language translation.

An Office Action mailed by the Korean Patent Office dated Jan. 28, 2021, which corresponds to Korean Patent Application 10-2019-7032969 and is related to U.S. Appl. No. 16/603,839; with English language translation.

An Office Action mailed by the Korean Intellectual Property Office dated Jul. 13, 2021, which corresponds to Korean Patent Application No. 10-2019-7032969 and is related to U.S. Appl. No. 16/603,839 with English language translation.

An Office Action issued by the German Patent Office dated Jun. 11, 2021, which corresponds to German Patent Application No. 11 2017 007 548.3 and is related to U.S. Appl. No. 16/603,839 with English language translation.

An Office Action mailed by the Korean Intellectual Property Office dated Sep. 6, 2021, which corresponds to Korean Patent Application No. 10-2019-7032969 and is related to U.S. Appl. No. 16/603,839; with English language translation.

* cited by examiner

AMPLIFIER

FIELD

The present invention relates to an amplifier.

BACKGROUND

Patent Literature 1 discloses that an FET is fixed to a dielectric substrate on a metal carrier, a microstrip line is formed on the dielectric substrate, and each of gate electrode and drain electrode of the FET is connected to an input-output upper electrode, which is wider than the microstrip line, of the microstrip line through a plurality of metal wires. Patent Literature 1 also discloses that the metal wires are arranged from an edge portion to a central portion in a width direction of the FET with the lengths of the metal wires being gradually increased.

Patent Literature 2 discloses a microwave amplifier in which an input-output terminal is connected to an input-output electrode of a semiconductor amplifying device through a plurality of wires. The microwave amplifier includes a wire array of the plurality of wires, and a wire at a center has a minimal impedance value while the other wires have larger impedance values as being closer to each side of the wire array. This allows for uniformizing powers transmitted through the wires to improve the gain, power added efficiency, and strain characteristics of the microwave amplifier.

PRIOR ART

Patent Literature

Patent Literature 1: JP H10-223674 A
Patent Literature 2: JP H11-238851 A

SUMMARY

Technical Problem

An amplifier is manufactured by die-bonding a transistor chip with a matching substrate in a package and achieving necessary electrical connection using a bonding wire. For a discrete amplifier, which is not internally matched, a transistor chip is wired to a matching substrate and an input-output terminal of a package is wired to the matching substrate.

To meet a demand for increasing an output from an amplifier, in some cases, a transistor chip with a plurality of parallel transistor cells being connected is used. It is preferable that the plurality of transistor cells uniformly operate. However, interaction of magnetic fields from a plurality of parallel wires and skin effect of a conductor such as a terminal causes a phase difference in an input-output signal of each transistor cell. This makes the operations of the plurality of transistor cells non-uniform. As a result, the power gain, saturated output power, and power added efficiency of the amplifier is lowered as compared with an instance where the plurality of transistor cells would uniformly operate.

An object of the present invention, which has been made to solve the above problem, is to provide an amplifier capable of uniform operations of a plurality of transistor cells formed on a transistor chip.

Means for Solving the Problems

According to a present invention, an amplifier includes a transistor chip having a plurality of transistor cells, a gate pad, and a drain pad, a matching substrate having a surface on which a metal pattern is formed, a terminal with a width larger than a width of the transistor chip and than a width of the matching substrate, a plurality of terminal wires connecting the terminal to the metal pattern, and a plurality of chip wires connecting the metal pattern to the transistor chip, wherein inter-wire distances of portions of the plurality of terminal wires connected to the metal pattern are larger than inter-wire distances between portions of the plurality of terminal wires connected to the terminal.

According to another aspect of the present invention, an amplifier includes a transistor chip having a plurality of transistor cells, a gate pad, and a drain pad, a matching substrate having a surface on which a metal pattern is formed, the metal pattern having a width larger than a width of the gate pad or a width of the drain pad, a terminal, a plurality of terminal wires connecting the terminal to the metal pattern, and a plurality of chip wires connecting the metal pattern to the transistor chip, wherein inter-wire distances between portions of the plurality of chip wires connected to the transistor chip are larger than inter-wire distances between portions of the plurality of chip wires connected to the metal pattern.

Other features of the present invention will be made clear in the following.

Advantageous Effects of Invention

According to the present invention, a plurality of wires are arranged in a non-parallel manner and the wires are connected to places less influenced by skin effect, thus allowing a plurality of transistor cells formed on a transistor chip to uniformly operate.

DESCRIPTION OF EMBODIMENTS

Figure 1:
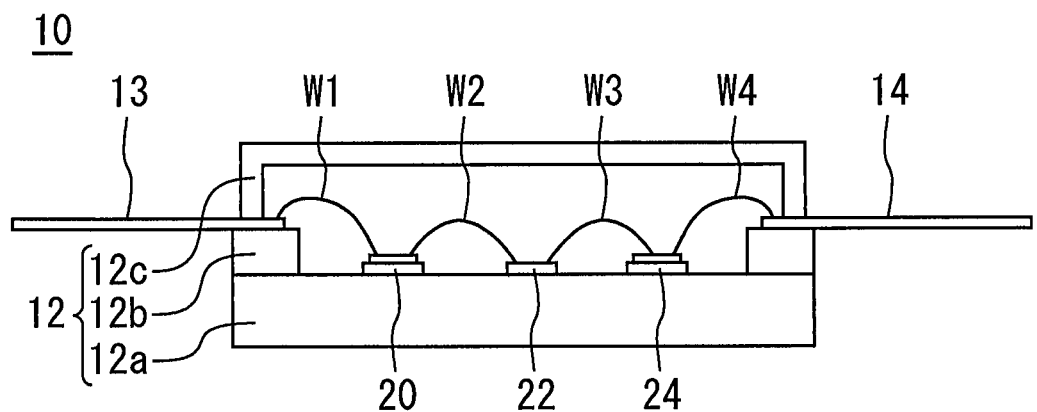
FIG. 1 is a sectional view of an amplifier according to an embodiment 1.

An amplifier according to an embodiment will be described with reference to drawings. The same reference character is provided to the same or corresponding component and a duplicated description of the component will be omitted.

Embodiment 1

FIG. 1 is a sectional view of an amplifier 10 according to an embodiment 1. The amplifier 10 includes a package 12. The package 12 includes a metal base portion 12a, a side wall portion 12b located on the metal base portion 12a, and a cover portion 12c located on the side wall portion 12b. A terminal 13 and a terminal 14 are fixed to the package 12.

Only the terminal 13 and the terminal 14 are exposed from the package 12. Matching substrates 20, 24 and a transistor chip 22 are located in the package 12. The matching substrate 20, the transistor chip 22, and the matching substrate 24 are formed on separate substrates individually. The transistor chip 22 is, for instance, a field-effect transistor made of GaN or the like.

The terminal 13 and the matching substrate 20 are connected to each other through a terminal wire W1. The matching substrate 20 and the transistor chip 22 are connected to each other through a chip wire W2. The transistor chip 22 and the matching substrate 24 are connected to each other through a chip wire W3. The matching substrate 24 and the terminal 14 are connected to each other through a terminal wire W4. An input-output connection structure of the amplifier 10 including the transistor chip 22 is thus provided. It should be noted that a different configuration may be applied to the package 12.

Figure 2:
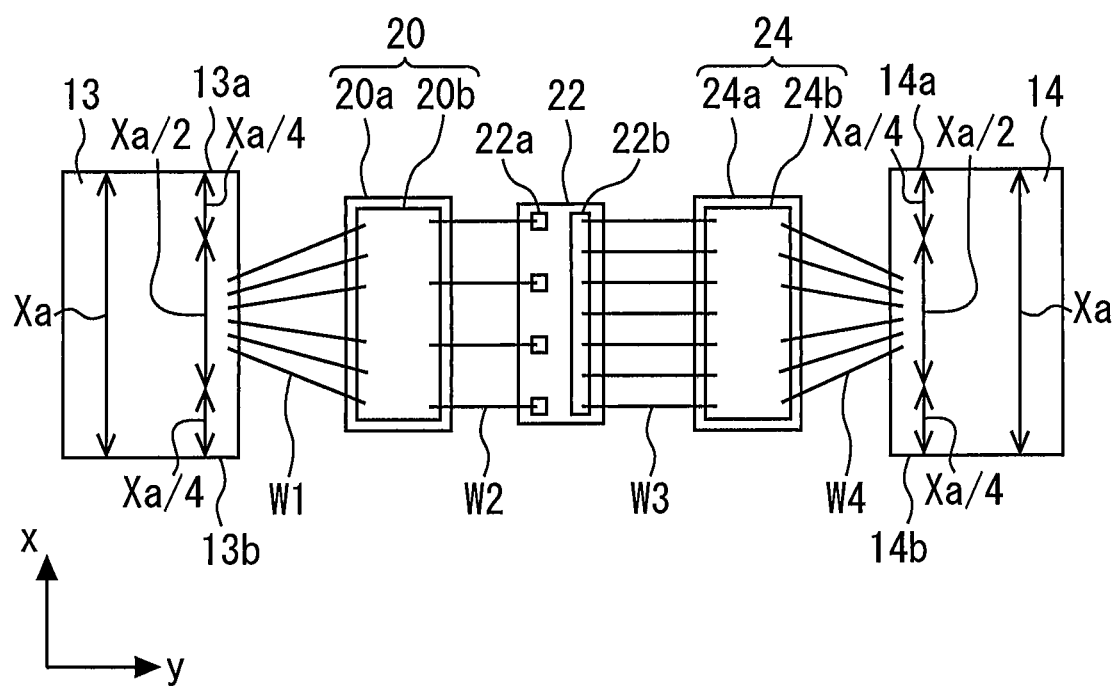
FIG. 2 is a plan view of an inside of the package.

FIG. 2 is a plan view of an inside of the package 12. In FIG. 2, an x-direction means a width direction and a y-direction means a length direction. In other words, the y-direction is a transmission direction of a high-frequency signal and the x-direction is a direction perpendicular to the transmission direction. The transistor chip 22 includes a plurality of transistor cells to achieve high output. The transistor chip 22 includes a plurality of gate pads 22a arranged along the width direction and a stripe-shaped drain pad 22b extending in the width direction. When the transistor chip 22 is viewed as a whole, a dimension of the transistor chip 22 in the width direction is larger than that in the length direction.

The matching substrate 20 includes a dielectric body 20a and a metal pattern 20b provided on the dielectric body 20a. In other words, the metal pattern 20b is formed on a surface of the matching substrate 20. The matching substrate 20 functions as an input matching substrate.

The matching substrate 24 includes a dielectric body 24a and a metal pattern 24b provided on the dielectric body 24a. In other words, the metal pattern 24b is formed on a surface of the matching substrate 24. The matching substrate 24 functions as an output matching substrate.

The terminals 13, 14 each have a width Xa. The width Xa is larger than each of a width of the transistor chip 22, a width of each of the matching substrates 20, 24, and a width of each of the metal patterns 20b, 24b. The terminal 13 functions as an input terminal. The terminal 14 functions as an output terminal.

The plurality of terminal wires W1 are provided. The plurality of terminal wires W1 connect the terminal 13 to the metal pattern 20b. When the width of the terminal 13 is denoted by Xa, connection points of the plurality of terminal wires W1 to the terminal 13 are located only between a position distanced from one end 13a in the width direction of the terminal 13 toward the other end 13b in the width direction of the terminal 13 by Xa/4 and a position distanced from the other end 13b toward the one end 13a by Xa/4. Xa/4 means a value given by dividing Xa by 4. The connection points of the plurality of terminal wires W1 to the terminal 13 are not present across the terminal 13 in the width direction but concentrated at a central portion of the terminal 13 at a position distanced from one end 13a in the width direction of the terminal 13 toward the other end 13b in the width direction of the terminal 13 by Xa/2.

Connection points of the terminal wire W1 to the metal pattern 20b are present across the metal pattern 20b in the width direction. As a result, inter-wire distances between portions of the plurality of terminal wires W1 connected to the metal pattern 20b are larger than inter-wire distances between portions of the plurality of terminal wires W1 connected to the terminal 13. Thus, the plurality of terminal wires W1 have larger inter-terminal distances as extending further in a positive y-direction. Simultaneously, the plurality of terminal wires W1 have longer wire lengths as being closer to each side thereof. The plurality of terminal wires W1 are arranged in a non-parallel manner.

The plurality of terminal wires W4 are provided. The plurality of terminal wires W4 connect the terminal 14 to the metal pattern 24b. When the width of the terminal 14 is denoted by Xa, connection points of the plurality of terminal wires W4 to the terminal 14 are located only between a position distanced from one end 14a in the width direction of the terminal 14 toward the other end 14b in the width direction of the terminal 14 by Xa/4 and a position distanced from the other end 14b toward the one end 14a by Xa/4. Thus, the connection points of the plurality of terminal wires W4 to the terminal 14 are not present across the terminal 14 in the width direction but concentrated at a central portion of the terminal 14.

Connection points of the terminal wire W4 to the metal pattern 24b are present across the metal pattern 24b in the width direction. As a result, inter-wire distances between portions of the plurality of terminal wires W4 connected to the metal pattern 24b are larger than inter-wire distances between portions of the plurality of terminal wires W4 connected to the terminal 14. Thus, the plurality of terminal wires W4 have larger inter-terminal distances as extending further in a negative y-direction. Simultaneously, the plurality of terminal wires W4 have longer wire lengths as being closer to each side thereof. The plurality of terminal wires W4 are arranged in a non-parallel manner.

The plurality of chip wires W2 are provided. The chip wires W2 connect the metal pattern 20b to the transistor chip 22. Specifically, the plurality of chip wires W2 connect the metal pattern 20b to the gate pads 22a. The chip wires W2 are connected one-to-one to the gate pads 22a. The plurality of chip wires W2 are arranged in parallel with each other.

The plurality of chip wires W3 are provided. The chip wires W3 connect the metal pattern 24b to the transistor chip 22. Specifically, the plurality of chip wires W3 connect the metal pattern 24b to the drain pad 22b. All the chip wires W3 are connected to the single drain pad 22b. The plurality of chip wires W3 are arranged in parallel with each other.

The plurality of terminal wires W1 are referred to as first wires, the plurality of terminal wires W4 are referred to as fourth wires, the plurality of chip wires W2 are referred to as second wires, the plurality of chip wires W3 are referred to as third wires. In this case, it can be described that a high-frequency signal is transmitted through the first wires, the second wires, the third wires, and the fourth wires in this order and outputted from the terminal 14.

Figure 3:
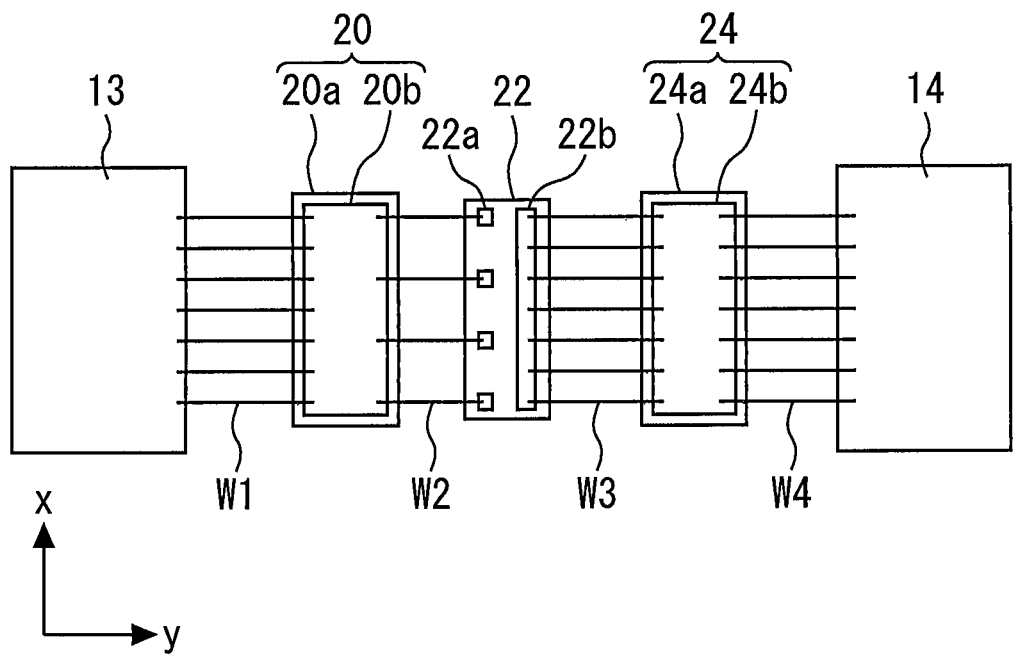
FIG. 3 is a plan view showing an inner structure of the amplifier according to a comparative example.

FIG. 3 is a plan view showing an inner structure of the package of the amplifier according to a comparative example. The plurality of terminal wires W1 are arranged in parallel with each other, the plurality of chip wires W2 are arranged in parallel with each other, the plurality of chip wires W3 are arranged in parallel with each other, and the plurality of terminal wires W4 are arranged in parallel with each other.

Figure 4:
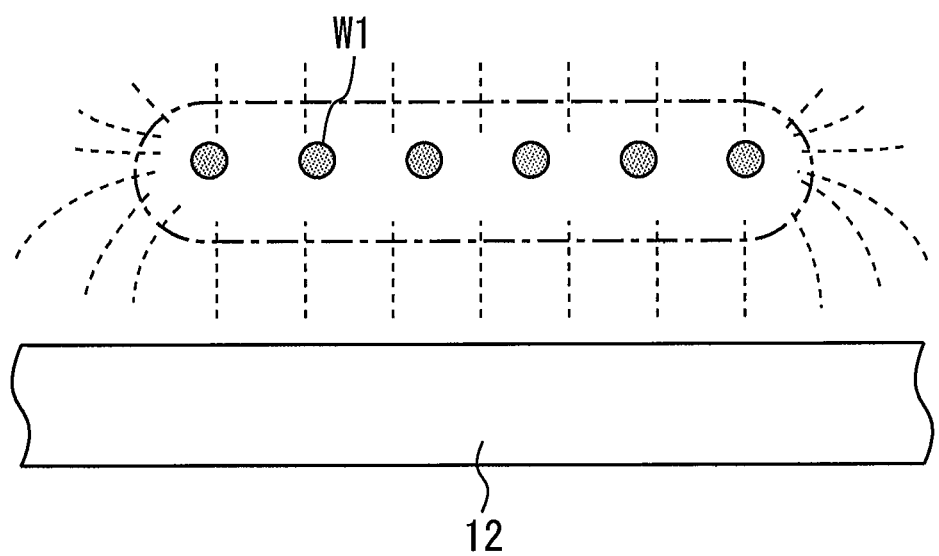
FIG. 4 is a sectional view of the plurality of terminal wires according to the comparative example.

FIG. 4 is a sectional view of the plurality of terminal wires W1 according to the comparative example. When electric currents flow through the plurality of terminal wires W1, magnetic fields are generated around the plurality of terminal wires W1. When the electric currents flow through the plurality of terminal wires W1 in the same direction, the magnetic fields between the terminal wires W1 are cancelled each other. Thus, the magnetic field of the plurality of terminal wires W1 as a whole is shown by chain lines in FIG. 4. Dashed lines show lines of electric force. A density of the lines of electric force shows an intensity of an electric field. The electric field is generated perpendicularly to the magnetic fields between the terminal wires W1 and the package 12. However, since each of the terminal wires W1 at both sides is adjacent to a small number of the terminal wire(s) W1 as compared with the central terminal wire W1, interaction between the magnetic fields thereof is reduced. This allows a more electric current to flow through each of the terminal wires W1 at both sides than an electric current through the central terminal wire. Thus, effective parasitic inductances of the terminal wires W1 at both sides are smaller than an effective parasitic inductance of the central terminal wire W1.

Figure 5:
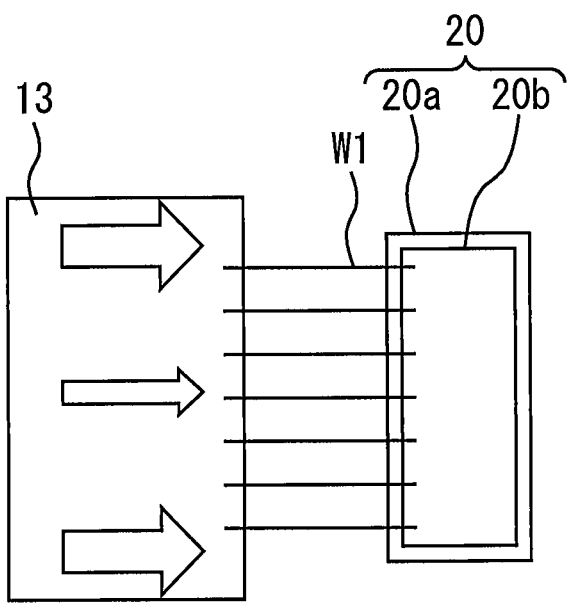
FIG. 5 shows that unbalanced electric currents due to skin effect.

Meanwhile, a larger electric current flows through each of the wide terminal 13 and terminal 14 at a position farther from a terminal center due to skin effect. FIG. 5 shows that electric currents flowing through the terminal are unbalanced due to skin effect. In FIG. 5, the plurality of terminal wires W1 are arranged in parallel with each other. Additionally, the plurality of terminal wires W1 are fixed not only to the center but also to end portions of the terminal 13. Large arrows represent large electric currents flowing through the end portions of the terminal 13. A small arrow represents a small electric current flowing through the center of the terminal 13. The large electric currents flowing through the terminal wires W1 at both sides make the effective parasitic inductances small in addition to the above-described interaction of the magnetic fields.

Since the effective parasitic inductances of the terminal wires W1 at both sides are small, especially, the transistor cells at both sides operate with a phase difference as compared with the central transistor cell. This results in non-uniformity of the operations of the plurality of transistor cells, reducing the power gain, saturated output power, and power added efficiency of the transistor chip 22. It should be noted that arranging the plurality of chip wires W2, the plurality of chip wires W3, or the plurality of terminal wires W4 in parallel also causes the same phenomenon.

In contrast, the amplifier 10 according to the embodiment 1 can solve the above problem. In the amplifier 10 according to the embodiment 1, the inter-wire distances between the portions of the plurality of terminal wires W1 connected to the metal pattern 20b are larger than the inter-wire distances between the portions of the plurality of terminal wires W1 connected to the terminal 13. The inter-wire distances are thus increased in a progressing direction of signal transmission, so that the terminal wires W1 have longer wire lengths as being closer to each side thereof. In other words, the central terminal wire W1 is the shortest, whereas the terminal wire W1 more distanced from the central terminal wire W1 is longer. This can offset a reduction in the parasitic inductances of the terminal wire W1 at each side and the terminal wires W1 near each side.

Likewise, the inter-wire distances between the portions of the plurality of terminal wires W4 connected to the metal pattern 24b are increased to be larger than the inter-wire distances between the portions of the plurality of terminal wires W4 connected to the terminal 14, restraining a reduction in the parasitic inductances of the terminal wire W4 at each side and the terminal wires W4 near each side.

Furthermore, since the plurality of terminal wires W1 are in a non-parallel manner, the electric currents flowing through the plurality of terminal wires W1 are also in a non-parallel manner. Thus, interaction of the magnetic fields between the plurality of terminal wires W1 is reduced as compared with an instance where the plurality of terminal wires W1 are in parallel with each other. This results in a reduction in deviation of the effective parasitic inductance of each of the terminal wires W1. Likewise, since the plurality of terminal wires W4 are also in a non-parallel manner, deviation of the effective parasitic inductances of the terminal wires W4 can be reduced. The amplifier 10 according to the embodiment 1 thus enables a reduction in adverse effects of interaction of the magnetic fields.

Adverse effects of skin effect are reduced by concentrating the wires at the center of each of the terminals 13, 14. Specifically, as described above, when the width of the terminal 13 is denoted by Xa, the connection points of the plurality of terminal wires W1 to the terminal 13 are located only between the position distanced from the one end 13a in the width direction of the terminal 13 toward the other end 13b in the width direction of the terminal 13 by Xa/4 and the position distanced from the other end 13b toward the one end 13a by Xa/4. Similarly, when the width of the terminal 14 is denoted by Xa, the connection points of the plurality of terminal wires W4 to the terminal 14 are located only between the position distanced from one end 14a in the width direction of the terminal 14 toward the other end 14b in the width direction of the terminal 14 by Xa/4 and the position distanced from the other end 14b toward the one end 14a by Xa/4. In other words, the connection points of the plurality of terminal wires W1 to the terminal 13 are concentrated at the central portion of the terminal 13 and the connection points of the plurality of terminal wires W4 to the terminal 14 are concentrated at the central portion of the terminal 14. Thus, while the terminals 13, 14 wider than the matching substrates 20, 24 and the metal patterns 20b, 24b are employed, large electric currents are less likely to flow through the outer terminal wires W1, W4 due to skin effect. A reduction in the effective parasitic inductances of the wires at both sides among the plurality of terminal wires W1, W4 can thus be reduced.

The amplifier 10 according to the embodiment 1 thus allows for reducing a phase difference between the signals of the transistor cells caused by interaction of the magnetic fields of the plurality of terminal wires W1, W4 and the skin effect in each of the terminals 13, 14. Consequently, the plurality of transistor cells formed on the transistor chip 22 are allowed to uniformly operate, so that the gain, output, and efficiency of the amplifier 10 become higher.

The amplifier 10 according to the embodiment 1 may be modified in a variety of manners not impairing the features thereof. For instance, even when the plurality of terminal wires W1 are arranged in parallel with each other, the plurality of transistor cells are allowed to operate uniformly to some extent as long as the plurality of terminal wires W4 have the above features. Similarly, even when the plurality of terminal wires W4 are arranged in parallel with each other, the plurality of transistor cells are allowed to operate uniformly to some extent as long as the plurality of terminal wires W1 have the above features. In addition, the above numerical limitations for concentrating the plurality of terminal wires W1 at the central portion of the terminal 13 and the plurality of terminal wires W4 at the central portion of the terminal 14 are merely exemplary. A distance between the connection points of the terminal wires W1 to the terminal 13 and each end portion of the terminal 13 and between the connection points of the terminal wires W4 to the terminal 14 and each end portion of the terminal 14 may be determined as needed.

The modifications referred to for the embodiment 1 may be applied to an amplifier according to the following embodiment. It should be noted that amplifier according to the following embodiment has a lot in common with that of the embodiment 1, so that description will be made mainly on differences from the embodiment 1.

Embodiment 2

Figure 6:
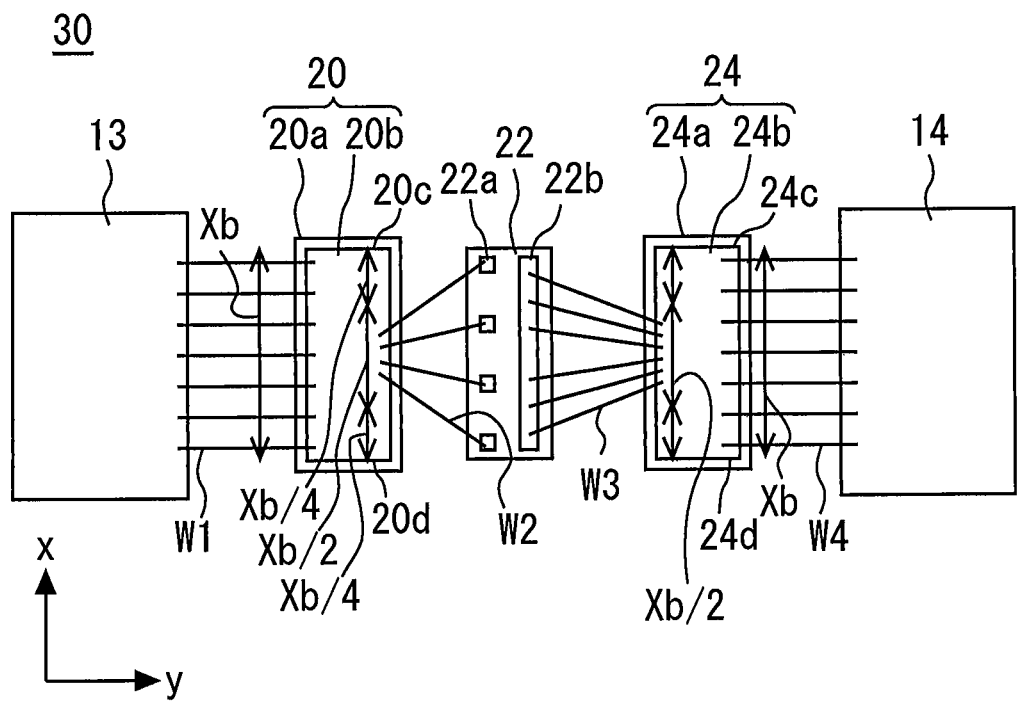
FIG. 6 is a plan view of an inside of an amplifier according to an embodiment 2.

FIG. 6 is a plan view of an inside of an amplifier 30 according to an embodiment 2. The metal patterns 20b, 24b are formed on surfaces of the matching substrates 20, 24, respectively. The metal patterns 20b, 24b each have a width larger than a width of the gate pads 22a and than a width of the drain pad 22b. The width of the gate pads 22a means a width of the plurality of gate pads 22a as a whole. The width of the gate pads 22a is substantially equal to the width of the drain pad 22b.

Since the width of the metal pattern 20b is larger than that of the gate pads 22a, the plurality of chip wires W2 can be arranged in parallel with each other. However, in the embodiment 2, the inter-wire distances between the portions of the plurality of chip wires W2 connected to the transistor chip 22 are larger than the inter-wire distances between the portions of the plurality of chip wires W2 connected to the metal pattern 20b. The plurality of chip wires W2 are thus arranged in a non-parallel manner, restraining a reduction in the effective parasitic inductances of the chip wires W2 at both sides due to interaction of the magnetic fields. In addition, the plurality of chip wires W2 have longer wire lengths as being closer to each side thereof, offsetting a reduction in the parasitic inductances of the chip wire W2 at each side and the chip wires W2 near each side.

In addition, concentrating the connection points of the plurality of chip wires W2 to the metal pattern 20b at the central portion of the metal pattern 20b away from each end portion of the metal pattern 20b allows for restraining a reduction in the effective parasitic inductances of the chip wires W2 at both sides due to the skin effect of the metal pattern 20b. In this regard, it is preferable that when the width of the metal pattern 20b is denoted by Xb, the connection points of the plurality of chip wires W2 to the metal pattern 20b are located only between a position distanced from one end 20c in the width direction of the metal pattern 20b toward the other end 20d in the width direction of the metal pattern 20b by Xb/4 and a position distanced from the other end 20d toward the one end 20c by Xb/4.

Since the width of the metal pattern 24b is larger than the width of the drain pad 22b, the plurality of chip wires W3 can be arranged in parallel with each other. However, in the embodiment 2, the inter-wire distances between the portions of the plurality of chip wires W3 connected to the transistor chip 22 are larger than the inter-wire distances between the portions of the plurality of chip wires W3 connected to the metal pattern 24b. The plurality of chip wires W3 are thus arranged in a non-parallel manner, restraining a reduction in the effective parasitic inductances of the chip wires W3 at both sides due to interaction of the magnetic fields. In addition, the plurality of chip wires W3 have longer wire lengths as being closer to each side thereof, offsetting a reduction in the parasitic inductances of the chip wires W3 at each side and the chip wires W3 near each side.

In addition, concentrating the connection points of the plurality of chip wires W3 to the metal pattern 24b at the central portion of the metal pattern 24b away from each end portion of the metal pattern 24b allows for restraining a reduction in the effective parasitic inductances of the chip wires W3 at both sides due to the skin effect of the metal pattern 24b. In this regard, it is preferable that when the width of the metal pattern 24b is denoted by Xb, the connection points of the plurality of chip wires W3 to the metal pattern 24b are located only between a position distanced from one end 24c in the width direction of the metal pattern 24b toward the other end 24d in the width direction of the metal pattern 24b by Xb/4 and a position distanced from the other end 24d toward the one end 24c by Xb/4.

The above configurations of the plurality of chip wires W2, W3 allow the plurality of transistor cells formed on the transistor chip 22 to uniformly operate. Even when the plurality of chip wires W3 are arranged in parallel with each other, the plurality of transistor cells are allowed to operate uniformly to some extent as long as the plurality of chip wires W2 have the above features. Even when the plurality of chip wires W2 are arranged in parallel with each other, the plurality of transistor cells are allowed to operate uniformly to some extent as long as the plurality of chip wires W3 have the above features. It should be noted that the terminal wires W1, W4 shown in FIG. 2 may be replaced with the terminal wires W1, W4 shown in FIG. 6 to further enhance the uniformity of the operations of the plurality of transistor cells.

DESCRIPTION OF SYMBOLS 13, 14 terminal, 20, 24 matching substrate, 22 transistor chip, W1, W4 terminal wire, W2, W3 chip wire

The invention claimed is:

1. An amplifier comprising:
a transistor chip comprising a plurality of transistor cells, a gate pad, and a drain pad;
a matching substrate having a surface on which a metal pattern is formed;
a terminal with a width larger than a width of the transistor chip and than a width of the matching substrate in a width direction;
a plurality of terminal wires connecting the terminal to the metal pattern; and
a plurality of chip wires connecting the metal pattern to the transistor chip, wherein
inter-wire distances are defined by distances between adjacent terminal wires of the plurality of terminal wires,
inter-wire distances of portions of the plurality of terminal wires connected to the metal pattern are larger than inter-wire distances between portions of the plurality of terminal wires connected to the terminal, and
the portions of the plurality of terminal wires connected to the terminal are concentrated at a central portion of the terminal in the width direction.

2. The amplifier according to claim 1, wherein
the matching substrate comprises an input matching substrate and an output matching substrate,
the terminal comprises an input terminal and an output terminal,
the plurality of terminal wires comprise a plurality of first wires connecting the input terminal to the input matching substrate and a plurality of fourth wires connecting the output matching substrate to the output terminal, and
the plurality of chip wires comprise a plurality of second wires connecting the input matching substrate to the transistor chip and a plurality of third wires connecting the transistor chip to the output matching substrate.

3. The amplifier according to claim 1, wherein the plurality of terminal wires have longer wire lengths as being closer to each side of the plurality of terminal wires.

4. The amplifier according to claim 3, wherein the plurality of terminal wires are arranged in a non-parallel manner.

5. The amplifier according to claim 1, wherein when the width of the terminal is denoted by Xa, connection points of the plurality of terminal wires to the terminal are located only between a position distanced from one end in a width direction of the terminal toward other end in the width direction of the terminal by Xa/4 and a position distanced from the other end toward the one end by Xa/4.

6. The amplifier according to claim 2, wherein when the width of the terminal is denoted by Xa, connection points of the plurality of terminal wires to the terminal are located only between a position distanced from one end in a width direction of the terminal toward other end in the width direction of the terminal by Xa/4 and a position distanced from the other end toward the one end by Xa/4.

7. The amplifier according to claim 3, wherein when the width of the terminal is denoted by Xa, connection points of the plurality of terminal wires to the terminal are located only between a position distanced from one end in a width direction of the terminal toward other end in the width direction of the terminal by Xa/4 and a position distanced from the other end toward the one end by Xa/4.

8. The amplifier according to claim 4, wherein when the width of the terminal is denoted by Xa, connection points of the plurality of terminal wires to the terminal are located only between a position distanced from one end in a width direction of the terminal toward other end in the width direction of the terminal by Xa/4 and a position distanced from the other end toward the one end by Xa/4.

9. An amplifier comprising:
a transistor chip comprising a plurality of transistor cells, a gate pad, and a drain pad;
a matching substrate having a surface on which a metal pattern is formed, the metal pattern having a width larger than a width of the gate pad or a width of the drain pad;
a terminal;
a plurality of terminal wires connecting the terminal to the metal pattern; and
a plurality of chip wires connecting the metal pattern to the transistor chip, wherein
inter-wire distances are defined by distances between adjacent chip wires of the plurality of chip wires,
inter-wire distances between portions of the plurality of chip wires connected to the transistor chip are larger than inter-wire distances between portions of the plurality of chip wires connected to the metal pattern, and
when the width of the metal pattern is denoted by Xb, connection points of the plurality of chip wires to the metal pattern are located only between a position distanced from one end in a width direction of the metal pattern toward other end in the width direction of the metal pattern by Xb/4 and a position distanced from the other end toward the one end by Xb/4.

10. The amplifier according to claim 9, wherein
the matching substrate comprises an input matching substrate and an output matching substrate,
the terminal comprises an input terminal and an output terminal,
the plurality of terminal wires comprise a plurality of first wires connecting the input terminal to the input matching substrate and a plurality of fourth wires connecting the output matching substrate to the output terminal, and
the plurality of chip wires comprise a plurality of second wires connecting the input matching substrate to the transistor chip and a plurality of third wires connecting the transistor chip to the output matching substrate.

11. The amplifier according to claim 9, wherein the plurality of chip wires have longer wire lengths as being closer to each side of the plurality of chip wires.

12. The amplifier according to claim 11, wherein the plurality of chip wires are arranged in a non-parallel manner.

* * * * *